United States Patent
Chung et al.

(10) Patent No.: US 7,884,384 B2
(45) Date of Patent: Feb. 8, 2011

(54) LIGHT EMITTING DIODE DEVICE AND FABRICATION METHOD THEREOF

(75) Inventors: Shu-Ru Chung, Taichung County (TW); Kuan-Wen Wang, Taipei (TW); Chih-Cheng Chiang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 412 days.

(21) Appl. No.: 11/874,834

(22) Filed: Oct. 18, 2007

(65) Prior Publication Data

US 2009/0001395 A1 Jan. 1, 2009

(30) Foreign Application Priority Data

Jun. 29, 2007 (TW) .............................. 96123738 A

(51) Int. Cl.
*H01L 33/00* (2010.01)
*H01L 21/00* (2006.01)
(52) U.S. Cl. .......................... 257/98; 257/99; 257/100; 257/E33.059; 257/E33.06; 257/E33.074; 438/26; 438/27; 438/29
(58) Field of Classification Search .................. 257/99, 257/100, E33.059, E33.06, E33.074, 98; 313/501–503, 512; 438/26, 27, 29
See application file for complete search history.

(56) References Cited

U.S. PATENT DOCUMENTS

| 5,962,971 | A | 10/1999 | Chen |
| 5,998,925 | A | 12/1999 | Shimizu et al. |
| 6,207,229 | B1 * | 3/2001 | Bawendi et al. ............. 427/215 |
| 6,245,259 | B1 | 6/2001 | Hohn et al. |
| 6,501,091 | B1 | 12/2002 | Bawendi et al. |
| 6,504,179 | B1 | 1/2003 | Ellens et al. |
| 2005/0215164 | A1 * | 9/2005 | Mueller et al. ................. 445/24 |
| 2006/0081862 | A1 * | 4/2006 | Chua et al. .................... 257/98 |
| 2006/0164003 | A1 * | 7/2006 | Chan et al. .................. 313/498 |
| 2007/0202333 | A1 * | 8/2007 | O'Brien et al. ............. 428/402 |
| 2007/0228390 | A1 * | 10/2007 | Hattori et al. ................. 257/79 |

FOREIGN PATENT DOCUMENTS

GB 2429838 A * 3/2007

* cited by examiner

Primary Examiner—Minh-Loan T Tran
Assistant Examiner—Leslie Pilar Cruz

(57) ABSTRACT

The invention provides a light emitting diode device and a fabrication method thereof. The device comprises a pair of electrodes and one of which is electrically contacted with a holder, an LED chip fixed in the holder, a wrapping material formed in the holder and covering the LED chip, and a plurality of nanocrystals having a quantum dot state dispersed in the wrapping material. The nanocrystals satisfy the formula, $Zn_{1-x}Cd_xS$ and $0<x<1$, and can produce a luminous wavelength of about 400 nm to 800 nm. The device further comprises a plurality of organic molecules bonded to the surface of the nanocrystals. Because a molecular interaction occurs between the organic molecules and the wrapping material, the nanocrystals are uniformly dispersed in the wrapping material to improve luminous uniformity. Furthermore, the wrapping material can protect the nanocrystals from oxidation to avoid efficiency decaying.

19 Claims, 5 Drawing Sheets

LIGHT EMITTING DIODE DEVICE AND FABRICATION METHOD THEREOF

BACKGROUND OF THE INVENTION

1. Field of the Invention

The invention relates to light emitting diode (LED) devices, and more particularly to a white light emitting diode device (WLED) and a fabrication method thereof.

2. Description of the Related Art

Light emitting diode (LED) devices are widely used in display products because of their advantages such as brightness, small size, light weight less power consumption and longer lifetime. Additionally, since white emitting diode (WLED) device was developed by Nichia Company, application of WLED device have expanded more and more to illumination product. Compared to incandescent or fluorescent lamps, the advantages of WLED products include less heat-generation, less power consumption, longer lifetime, small size and rapid response speed. The average power consumption of WLED is about one-eight times that of incandescent lamps and one-half times that of fluorescent lamps. Accordingly, the average lifetime span of the WLED is more than 8,000 hours, which is 10 times higher than that of fluorescent lamps.

Currently, fabrication of WLED mainly includes two methods. The first method, generally, utilizes a plurality of LED chips, namely, red, green and blue LED chips are packaged together, and white light can be obtained by mixing those individual lights. The second method, generally, called a single LED chip. Various prearranged phosphors were excited by this single LED chip, and the white light was obtained by mixing the light of chip and phosphor. For example, yellow phosphors can be excited by a single blue LED chip to produce yellow light, then, the yellow light can be mixed with blue light emitted by the blue LED chip to produce white light. As the same way, the prearranged blue, green and red phosphors can be excited by an LED chip capable of emitting ultraviolet light to mix with and produce white light.

In FIG. 1, a cross section of a conventional white light emitting diode (WLED) is shown. In FIG. 1, an yttrium aluminum garnet (YAG) phosphor 4 absorbs blue light, which emitted from an LED chip 2 to produce yellow light. Then, yellow light emitted from the YAG phosphor 4, is mixed with blue light emitted from the LED chip 2 to obtain a white light. Fabrication of the YAG phosphor 4, however, is a complicated and a high temperature process. So that fabrication costs are expensive. Moreover, because the YAG phosphor 4 has a relatively huge diameter (micro-scaling) and is not easily dissolved in organic solvents, the YAG phosphor 4 is not easily and uniformly dispersed in an organic wrapping material. This phenomenon makes the uniformity of WLED less luminous. Furthermore, because red light is not provided, color rending index (CRI) of WLED is not good enough.

Additionally, in an ultraviolet LED chip type, in order to get white light, mixing red, green and blue phosphors is required. Accordingly, three kinds of phosphor need to be individual prepared at high temperature, the entire process is also time-consuming. Moreover, because luminous efficiency and decay rate of phosphors are different, fabrication and design of the WLED is complicated.

Thus, a light emitting diode device using a single phosphor and a method for fabricating thereof to improve color rending index and luminous uniformity is desired.

BRIEF SUMMARY OF INVENTION

Accordingly, the invention provides a light emitting diode (LED) device. The device comprises a pair of electrodes, a holder electrically contacted with one of the electrodes, an LED chip fixed in the holder, a wrapping material filled into the holder and covering the LED chip, and a plurality of nanocrystals dispersed in the wrapping material. The nanocrystals, called quantum dots, satisfied the formula, $Zn_{1-x}Cd_xS$ with $0<X<1$, are capable of emitting a luminous wavelength of about 400 nm to 800 nm. A plurality of organic molecules bonded to the surface of each nanocrystal and the organic molecules are capable of amalgamating with the polymer resin serving as the wrapping material. Because of the organic molecules, the nanocrystals can be uniformly dispersed in the wrapping material to improve luminous efficiency of the LED device. The organic molecules are organic reactants, which was utilized in preparation of the nanocrystals, or to modify the surface of the nanocrystals for amalgamating with the selected wrapping material. Furthermore, the wrapping material can protect the nanocrystals from oxidation and avoid efficiency decay.

Also, the invention provides a method for fabricating an LED device. The method comprises: providing a pair of electrodes electrically contacted with a holder; fixing an LED chip in the holder; forming a wrapping material in the holder and covering the LED chip; and dispersing a plurality of nanocrystals with quantum dot state in the wrapping material. The nanocrystals satisfy the formula, $Zn_{1-x}Cd_xS$ with $0<x<1$, and are capable of emitting a luminous wavelength of about 400 nm to 800 nm.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
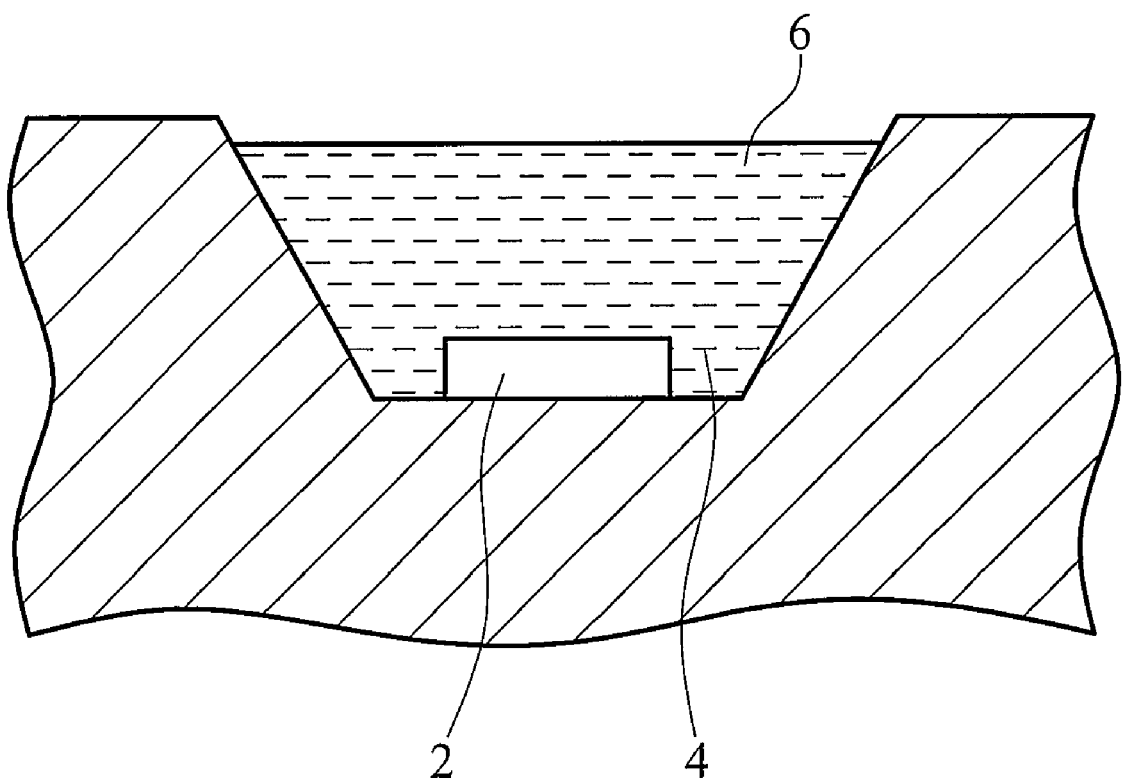
FIG. 1 is a cross section of a conventional white light emitting diode device.

The following description is of the best-contemplated mode of carrying out the invention. This description is made for the purpose of illustrating the general principles of the invention and should not be taken in a limiting sense. The scope of the invention is best determined by reference to the appended claims.

First Embodiment $Zn_{0.8}Cd_{0.2}S$ as a Phosphor for an LED

A plurality of nanocrystals with quantum dot state is added to a polymer/monomer such as methyl methacrylate (MMA) to prepare a wrapping material precursor solution having the nanocrystals therein. In the first embodiment, the $Zn_{0.8}Cd_{0.2}S$ nanocrystals preferably prepared by liquid-phase synthesis or vapor-phase synthesis.

In an exemplary embodiment of liquid-phase synthesis, at first, cadmium oxide (CdO) and zinc oxide (ZnO) were mixed with stearic acid (SA) to obtain a complex solution. Then, tri-octylphosphine oxide (TOPO) and hexadecylamine (HAD) were added to the complex solution to obtain a homogeneous solution A. Additionally, an appropriate amount of sulfur (S) powder was dissolved in octadecen to obtain an optical colorless solution B.

Next, the solution A was mixed with the solution B to produce the $Z_{0.8}Cd_{0.2}S$ quantum dot nanocrystals, referred to as $Z_{0.8}Cd_{0.2}S$ quantum dot, hereafter. Meanwhile, the organic molecules comprising stearic acid (SA), hexadecylamine (HAD) and tri-octylphosphine (TOPO), bonded to the surface of the nanocrystals during reaction. Accordingly, when $Z_{0.8}Cd_{0.2}S$ quantum dot were added to the polymer/monomer, a molecular interaction between the organic molecules bonded to the surface of the $Z_{0.8}Cd_{0.2}S$ quantum dot and the polymer/monomer occurred, whereby the $Z_{0.8}Cd_{0.2}S$ quantum dot was be easily and uniformly dispersed in the polymer/monomer.

Note that before mixing the nanocrystals with the polymer/monomer, thiol, phospholipids or any other suitable organic molecule was optionally utilized in place of stearic acid to easily and uniformly disperse in the selected resin monomer. Specifically, the organic molecules, bonded to the surface of $Z_{0.8}Cd_{0.2}S$ quantum dot, may be replaced by an organic material amalgamating with the polymer/monomer to modify the surface for uniformed dispersal.

After mixing the nanocrystals with the polymer/monomer, an ultrasonic treatment was executed to uniformly disperse the nanocrystals in the polymer/monomer. Next, the precursor solution was heated to a temperature of about 80° C. to 90° C. for about 10 mins to 60 mins, the polymer/monomer was then pre-polymerized to produce a resin solution having the nanocrystals, also referred to as a solution C. Preferably, the reaction temperature is about 90° C. and duration is about 20 mins.

The resin solution, which contains the nanocrystals therein, was coated on a UV light emitting diode (LED) chip. The LED chip with the resin solution thereon was placed at room temperature for 2 hours to cure the resin. Applying a voltage to the LED chip, a light with a luminous wavelength of about 350 nm to 420 nm was emitted. Meanwhile, the light excited $Z_{0.8}Cd_{0.2}S$ quantum dot, serving as a phosphor, to produce a visible light.

Moreover, before coating, the resin solution containing the nanocrystals can be optionally stirred by a high speed stirring machine to uniformly disperse $Z_{0.8}Cd_{0.2}S$ quantum dot in the resin solution. Note that the nanocrystals or, $Z_{0.8}Cd_{0.2}S$ quantum dot, can form a plurality of clusters in the resin solution and preferably each cluster has the dimensions of about 1 nm to 100 nm. Accordingly, the nanocrystals can be uniformly dispersed in the resin solution because the organic surfactant was covered its surface.

In the first embodiment, $Z_{0.8}Cd_{0.2}S$ quantum dot serving as a phosphor for an LED device was illustrated by two experimental examples mixing various amounts of $Z_{0.8}Cd_{0.2}S$ quantum dot in the resin solution. In the experimental example of 10% $Z_{0.8}Cd_{0.2}S$ quantum dot, a resin solution with 10% $Z_{0.8}Cd_{0.2}S$ quantum dot was coated on the LED chip. After the resin was cured, a voltage was applied to the LED chip, and an ultraviolet light with a luminous wavelength of about 350 nm to 420 nm was emitted to excite 10% $Z_{0.8}Cd_{0.2}S$ quantum dot for producing visible light.

According to the experimental example of the 10% $Z_{0.8}Cd_{0.2}S$ quantum dot, it was found that the visible light produced by the nanocrystals of the 10% $Z_{0.8}Cd_{0.2}S$ quantum dot had a color temperature of about 4000K to 5000K. Moreover, the visible light had CIE chromatic coordinates of 0.35~0.38, and 0.35~0.42. Accordingly, the experimental example of the 10% $Z_{0.8}Cd_{0.2}S$ quantum dot produced a white light, with color rending index (CRI) of about 81 to 83.

In another experimental example, it was found that the 5% $Z_{0.8}Cd_{0.2}S$ quantum dot serving as a phosphor for an LED device had a color temperature of about 4000K to 7000K and CIE chromatic coordinates with an X-axis from 0.27 to 0.38 and a Y-axis from 0.26 to 0.42. Accordingly, the 5% $Z_{0.8}Cd_{0.2}S$ quantum dot emitted a white light. Moreover, the white light, produced by the 5% $Z_{0.8}Cd_{0.2}S$ quantum dot, had a color rending index (CRI) of about 79 to 83.

Figure 2A:
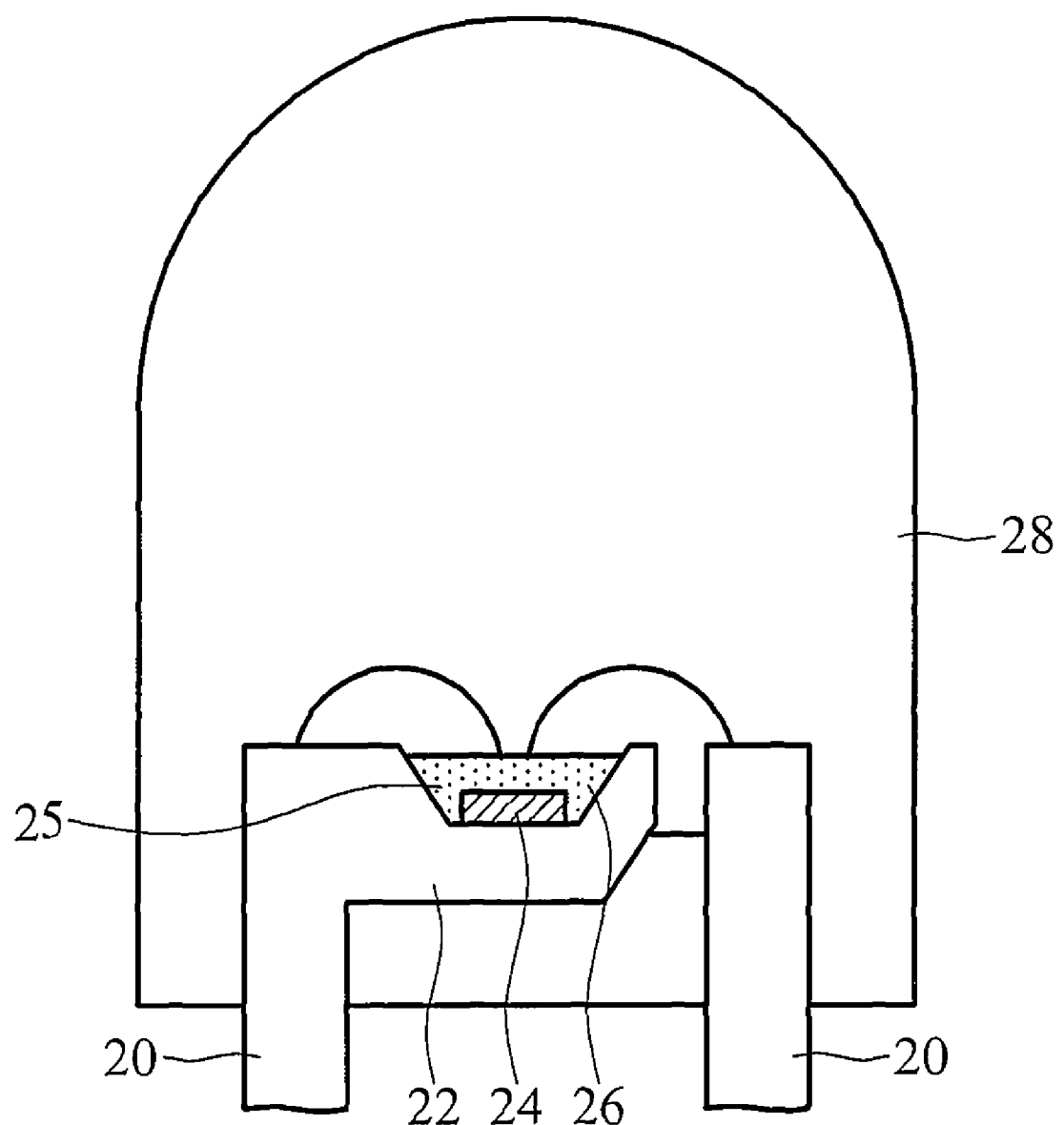
FIGS. 2A and 2B are cross sections of LED devices according to embodiments of the invention.

In FIG. 2A, a cross section of a light emitting diode (LED) device 30, using the $Z_{0.8}Cd_{0.2}S$ quantum dot as a phosphor according to the first embodiment of the invention is shown. In FIG. 2A, a pair of electrodes 20, one of which electrically contacts a holder 22, is provided. An LED chip 24 was disposed in the holder 22. Preferably, the LED chip 24 is capable of emitting a luminous wavelength of about 350 nm to 420 nm, for example ZnSe, ZnO, GaN, InGaN or SiC. In some embodiments, the LED chip 24 is fabricated by sputtering, metal organic chemical vapor deposition (MOCVD), liquid phase epitaxy (LPE), vapor phase epitaxy (VPE) or molecular beam epitaxy (MBE) for depositing a layer on a substrate such as sapphire.

Next, a wrapping material 26 was formed in the holder and covered the LED chip 24. A plurality of nanocrystals was then dispersed in the wrapping material 26. In one embodiment, the nanocrystals 25 such as the $Z_{0.8}Cd_{0.2}S$ quantum dot were added to a solution of wrapping material 26 such as polymer/monomer. The wrapping material 26 solution was formed in the holder 22 to cover the LED chip 24. A packaging material 26 next packaged the holder 22. Fabrication of the LED device 30, according to the first embodiment, was complete.

Preferably, the wrapping material 26 is made of a material such as epoxy, poly methyl methacrylate (PMMA) or silicone. Additionally, each nanocrystal preferably has a diameter of about 1 nm to 20 nm.

Figure 2B:
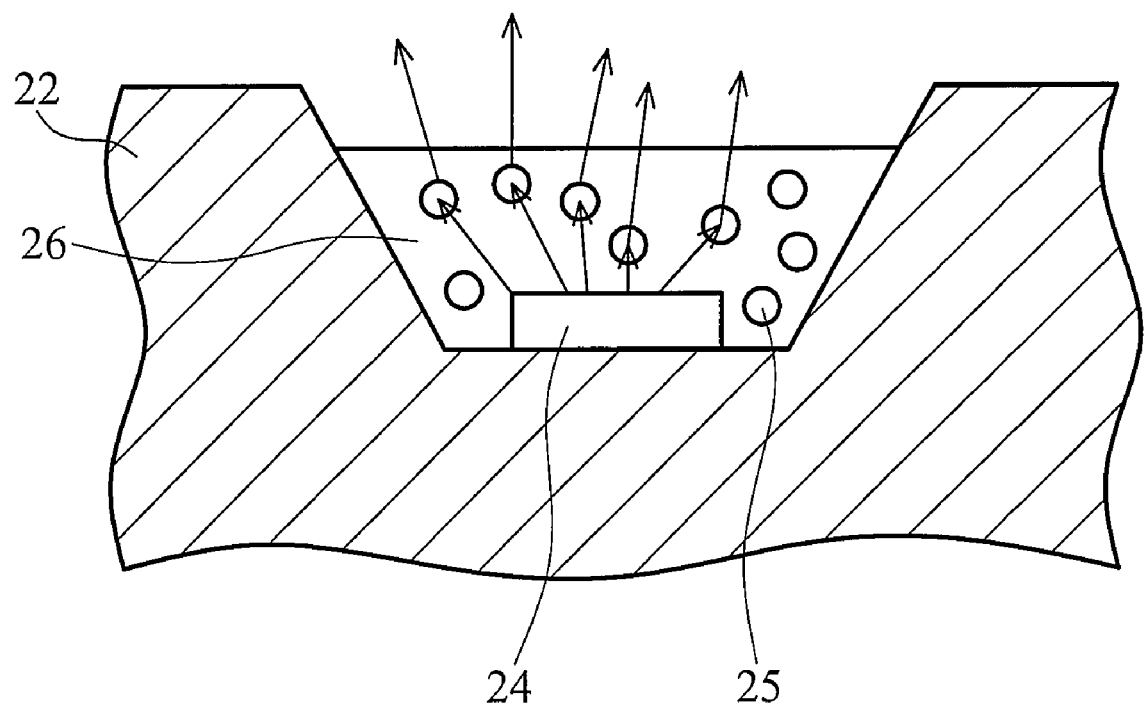

Next, a voltage was applied to the electrodes 20 to drive the LED chip 24 to emit a light. The nanocrystals 25 dispersed in the wrapping material 26 were excited by the light from the LED chip 24, so that the nanocrystals 25 produced a white light with wavelength of 400 nm to 800 nm, as shown by the arrows in FIG. 2B.

Note that the LED device, using the $Z_{0.8}Cd_{0.2}S$ quantum dot as a phosphor, produced a white light without mixing with other phosphors. Accordingly, fabrication process was shortened and costs were reduced. Moreover, because the $Z_{0.8}Cd_{0.2}S$ quantum dots were uniformly dispersed in the wrapping material, luminous uniformity of the LED device was improved.

Figure 3A:
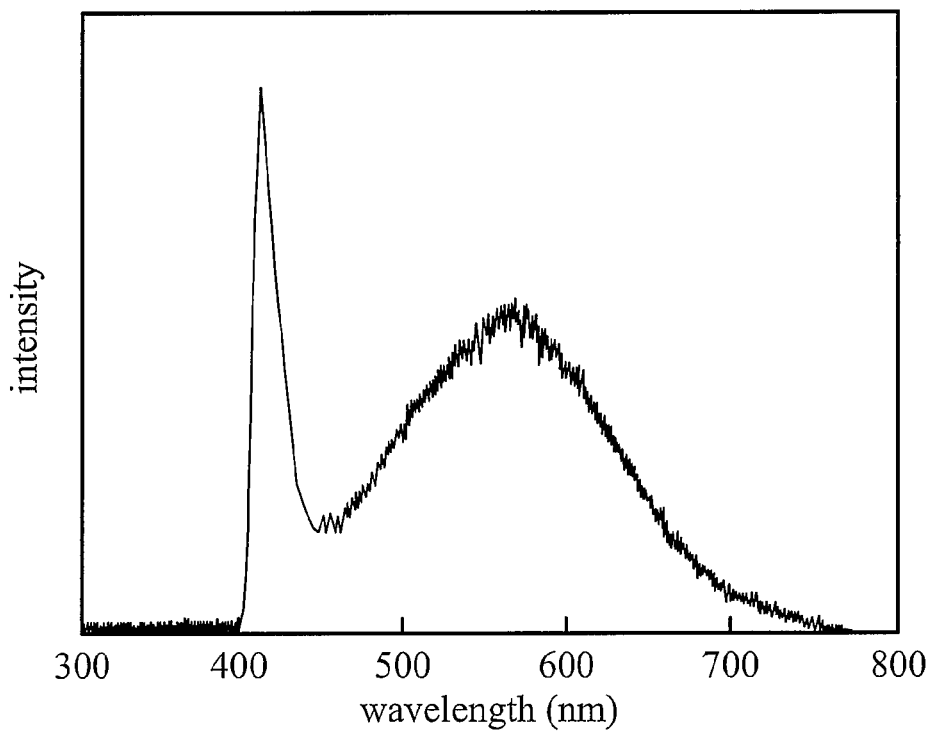
FIGS. 3A, 3B, 4A and 4B are PL spectrums of LED according to the embodiments of the invention.

FIG. 3A is a PL spectrum of the LED device according to the first embodiment of the invention. In FIG. 3A, the PL spectrum of the $Z_{0.8}Cd_{0.2}S$ quantum dot was excited by a luminous wavelength of about 400 nm from the LED chip. Referring to FIG. 3A, the LED device, using $Z_{0.8}Cd_{0.2}S$ quantum dot as a phosphor, produced a visible light with the most luminous intensity at 560 nm.

Second Embodiment $Z_{0.5}Cd_{0.5}S$ as a Phosphor for an LED

To prepare a wrapping material precursor solution containing nanocrystals, a plurality of nanocrystals, such as $Z_{0.5}Cd_{0.5}S$ quantum dot, were added to polymer/monomer wrapping material. The preparation of the $Z_{0.5}Cd_{0.5}S$ quantum dot was the same as that in the first embodiment of the invention, thus, the repeated description is not provided here. Moreover, reference may be made to the first embodiment of the invention concerning manner in which $Z_{0.5}Cd_{0.5}S$ quantum dot was dispersed in the wrapping material.

Next, the wrapping material solution was coated on an LED chip. In the second embodiment, whereby the $Z_{0.5}Cd_{0.5}S$ quantum dot served as a phosphor for an LED device, two experimental examples with different amounts of the $Z_{0.5}Cd_{0.5}S$ quantum dot added to the wrapping material were performed. The wrapping material solution with 10% $Z_{0.5}Cd_{0.5}S$ quantum dot and the wrapping material solution with 5% $Z_{0.5}Cd_{0.5}S$ quantum dot were coated on the LED chips, respectively. To cure the wrapping material, the LED chips were placed at room temperature for 2 hours. In the experimental example using the 10% $Z_{0.5}Cd_{0.5}S$ quantum dot, the LED chip emitted an ultraviolet light by applying a voltage to make the 10% $Z_{0.5}Cd_{0.5}S$ quantum dot produce a visible light.

According to the experimental example using the 10% $Z_{0.5}Cd_{0.5}S$ quantum dot, the visible light, produced by the 10% $Z_{0.5}Cd_{0.5}S$ quantum dot, had a color temperature of about 3750K to 5210K and CIE chromatic coordinates with an X-axis from 0.34 to 0.40 and a Y-axis from 0.32 to 0.42. Thus, the nanocrystals of 10% $Z_{0.5}Cd_{0.5}S$ quantum dot emitted a white light. Additionally, the white light emitted by the 10% $Z_{0.5}Cd_{0.5}S$ quantum dot had a color rending index of about 81 to 83.

According to the experimental example using the 5% $Z_{0.5}Cd_{0.5}S$ quantum dot, the visible light, produced by the 5% $Z_{0.5}Cd_{0.5}S$ quantum dot, had a color temperature of about 4164K to 4571K, CIE chromatic coordinates of X: 0.36~0.38, and Y: 0.36~0.38, and the 5% $Z_{0.5}Cd_{0.5}S$ quantum dot emitted a white light. Furthermore, the white light had a color rending index of about 82 to 83.

Referring to FIG. 2A, the wrapping material with $Z_{0.5}Cd_{0.5}S$ quantum dot was formed in a holder 22 and covered the LED chip 24. Next, the holder 22 was packaged by a packaging material 28. Thus, complete the fabrication of the LED device 30 using $Z_{0.5}Cd_{0.5}S$ quantum dot as a phosphor according to the second embodiment of the invention. The main difference between the second and the first embodiments, was that in the second embodiment $Z_{0.8}Cd_{0.2}S$ quantum dot was replaced by $Z_{0.5}Cd_{0.5}S$ quantum dot to act as a phosphor for the LED device. As such, like formations and materials of similar elements in the second embodiment described in the first embodiment are not provided here.

Next, a voltage was applied to the electrodes 20 to drive the LED chip 24 to emit a light. The nanocrystals 25 dispersed in the wrapping material 26 were excited by the light from the LED chip 24, thus, causing the nanocrystals 25 to produce a white light with wavelength of around 400 nm to 800 nm, as shown by the arrows in FIG. 2B.

Figure 3B:
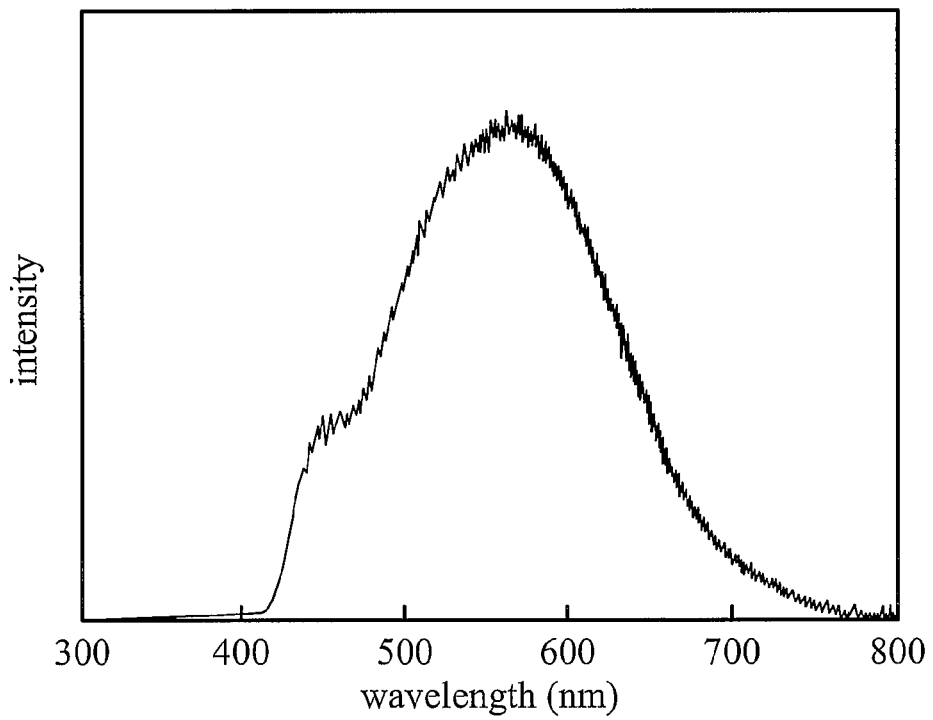

FIG. 3B is a PL spectrum of the LED device according to the second embodiment of the invention. In FIG. 3B, the PL spectrum of the $Z_{0.5}Cd_{0.5}S$ quantum dot was excited by the light with luminous wavelength of about 400 nm from the LED chip. Referring to FIG. 3B, the LED device, using the $Z_{0.5}Cd_{0.5}S$ quantum dot as a phosphor, produced a visible light with the most luminous intensity at 560 nm.

Note that poly methyl methacrylate is utilized to illustrate the wrapping material in the first and second embodiments, and in the following embodiments, silicone is used. However, they are only exemplary embodiments, and are not limited thereto.

Third Embodiment $Z_{0.8}Cd_{0.2}S$ as a Phosphor for an LED

The main difference between the first and the third embodiments is the wrapping material. The nanocrystals, such as the $Z_{0.8}Cd_{0.2}S$ of the first embodiment, were added to wrapping material such as silicone. As such, formations and materials of similar elements in the third embodiment described in the first embodiment are not provided here.

In the embodiment, a silicone solution serving as wrapping material is prepared. At first, a silicone was mixed with a hardening agent with a ratio of 1:1 to prepare the silicone solution, also referred to as a solution A. The nanocrystals of the $Z_{0.8}Cd_{0.2}S$ quantum dot were added to the solution A and an ultrasonic treatment was then executed to obtain a solution B, the silicone solution with the $Z_{0.8}Cd_{0.2}S$ quantum dot. Note that prior to mixing the nanocrystals with the silicone solution, the surface can be optionally modified to be uniformly dispersed in the silicone solution.

Next, the silicone solution with the $Z_{0.8}Cd_{0.2}S$ quantum dot is coated on an LED chip. A thermal treatment is then executed to cure the silicone solution on the LED chip. Preferably, the thermal treatment is performed at a temperature of about 120° C. for about 2 hours. Additionally, before coating, the silicone solution can be optionally stirred by a high speed stirring machine to uniformly disperse the nanocrystals of the $Z_{0.8}Cd_{0.2}S$ quantum dot in the silicon solution. Following, the described steps in the first embodiment are performed to complete the LED device, as shown in FIG. 2A.

After fabrication of the LED device according to the third embodiment of the invention, a voltage was applied to drive the LED device, resulting in the $Z_{0.8}Cd_{0.2}S$ quantum dot to produce a visible light.

Figure 4A:
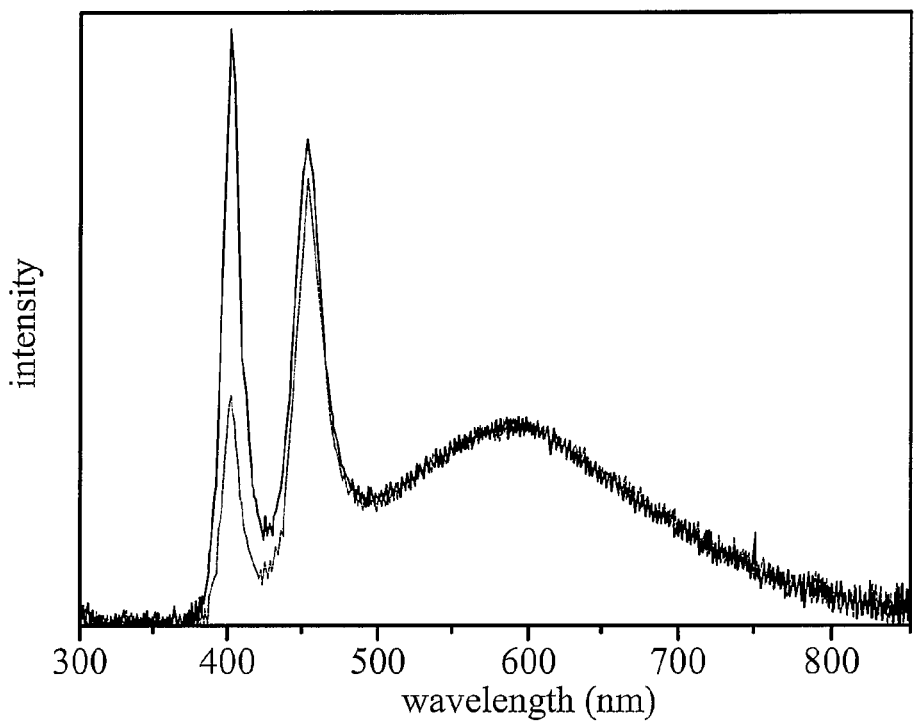

FIG. 4A is a PL spectrum of the LED device according to the third embodiment of the invention. In FIG. 4A, the $Z_{0.8}Cd_{0.2}S$ quantum dot produced a visible light of about 410 nm to 850 nm, with the most luminous intensity at 595 nm. The visible light had a color temperature of about 5763K to 6722K and CIE chromatic coordinates of 0.328~0.316, and 0.332~0.285. Moreover, the color rending index was of about 90 to 93.

Fourth Embodiment $Z_{0.5}Cd_{0.5}S$ as a Phosphor for an LED

The same nanocrystals or $Z_{0.5}Cd_{0.5}S$ quantum dot, as the second embodiment was added to silicone serving as a wrapping material. As such, formations and materials of similar elements in the fourth embodiment described in the first and the second embodiments are not provided here.

First, a solution of silicone (solution A) serving as wrapping material was prepared. A plurality of the $Z_{0.5}Cd_{0.5}S$ nanocrystals, the same as in the second embodiment, was added to the silicone solution. An ultrasonic treatment was then executed for about 30 mins to prepare a silicone solution with the $Z_{0.5}Cd_{0.5}S$ quantum dot, also referred to as a B solution. Next, the solution B was coated on an LED chip and a thermal treatment was then executed to cure the silicone solution on the LED chip. The similar following steps described in the third embodiments are not provided here.

Figure 4B:
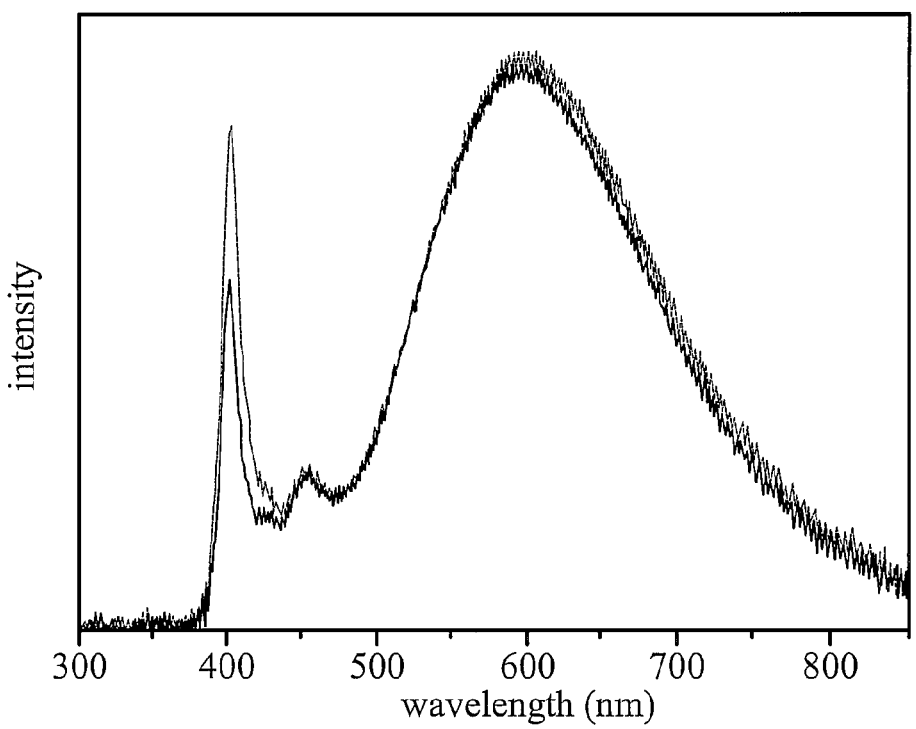

The described steps in the first embodiment are performed to complete fabrication of an LED device 30, as shown in FIG. 2A. FIG. 4B is a PL spectrum of the LED device according to the fourth embodiment of the invention. In FIG. 4B, the results of the two experimental examples of the fourth embodiment are shown. In FIG. 4B, the $Z_{0.5}Cd_{0.5}S$ quantum dot produced a visible light of about 410 nm to 850 nm, with the most luminous intensity at 595 nm. The visible light had a color temperature of about 3162K to 3191K and CIE chromatic coordinates of 0.435~0.436, and 0.421~0.426. Moreover, the color rending index was of about 83 to 83.

Note that because the nanocrystals have nano-scaled dimensions, the nanocrystals show quantum confinement effect. Thus, recombination of the carrier in the quantum dot is increased. Accordingly, the nanocrystals in the embodiments of the invention have a relatively higher luminous efficiency than conventional phosphors theoretically.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode (LED) device, comprising:
a pair of electrodes;
a holder electrically contacted with one of the electrodes;
an LED chip in the holder;
a wrapping material in the holder and covering the LED chip; and
a plurality of nanocrystals with quantum dot state dispersed in the wrapping material, wherein the nanocrystals have a main component satisfying the formula:

$$Zn_{1-x}Cd_xS$$

wherein 0<x<1 and the nanocrystals produce a white light without mixing with other phosphors having a luminous wavelength of about 400 nm to 800 nm.

2. The light emitting diode device as claimed in claim 1, wherein the LED chip has an electroluminescence wavelength of about 350 nm to 420 nm.

3. The light emitting diode device as claimed in claim 1, wherein the LED chip comprises ZnSe, ZnO, GaN, InGaN or SiC.

4. The light emitting diode device as claimed in claim 1, wherein the wrapping material comprises epoxy, PMMA or silicone.

5. The light emitting diode device as claimed in claim 1, wherein each nanocrystal has a diameter of about 1 nm to 20 nm.

6. The light emitting diode device as claimed in claim 1, wherein the nanocrystals dispersed in the wrapping material form a plurality of clusters, having the dimensions of about 1 nm to 100 nm.

7. The light emitting diode device as claimed in claim 1, further comprising a packaging material packaging the holder.

8. The light emitting diode device as claimed in claim 1, further comprising a plurality of organic molecules bonded to a surface of each nanocrystal.

9. The light emitting diode device as claimed in claim 8, wherein the organic molecules comprise thiol, fatty acid or phospholipids and derivatives thereof.

10. The light emitting diode device as claimed in claim 8, wherein the organic molecules comprise stearic acid, trioctylphosphine oxide or hexadecylamine.

11. A method for fabricating a light emitting diode (LED) device, comprising:
providing a pair of electrodes;
electrically contacting a holder with one of the electrodes;
disposing an LED chip in the holder;
forming a wrapping material in the holder and covering the LED chip; and
dispersing a plurality of nanocrystals with quantum dot state in the wrapping material, wherein the nanocrystals have a main component satisfying the formula:

$$Zn_{1-x}Cd_xS$$

wherein 0<X<1 and the nanocrystals produce a white light without mixing with other phosphors having a luminous wavelength of about 400 nm to 800 nm.

12. The method as claimed in claim 11, wherein the nanocyrstals are prepared by liquid-phase synthesis or vapor-phase synthesis.

13. The method as claimed in claim 11, wherein the wrapping material in the holder is formed by coating.

14. The method as claimed in claim 11, wherein forming the LED chip comprises:
providing a substrate; and
forming a layer on the substrate.

15. The method as claimed in claim 14, wherein the layer is formed by sputtering, metal organic chemical vapor deposition, liquid phase expitaxy, vapor phase epitaxy or molecular beam epitaxy.

16. The method as claimed in claim 11, prior to the forming of the wrapping material in the holder, further comprising:
dispersing the nanocrystals in a monomer of the wrapping material; and
performing pre-polymerization to form a solution comprising the nanocrystals.

17. The method as claimed in claim 16, further comprising performing an ultrasonic treatment subsequent to dispersing the nanocrystals in the monomer.

18. The method as claimed in claim 16, wherein the pre-polymerization is performed at a temperature of about 80° C. to 90° C.

19. The method as claimed in claim 16, wherein the pre-polymerization is performed for about 10 mins to 60 mins.

* * * * *